(12) United States Patent
Thirumoorthy

(10) Patent No.: US 7,148,821 B2
(45) Date of Patent: Dec. 12, 2006

(54) SYSTEM AND METHOD FOR PARTITION AND PATTERN-MATCH DECODING OF VARIABLE LENGTH CODES

(75) Inventor: Hari Thirumoorthy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/054,033

(22) Filed: Feb. 9, 2005

(65) Prior Publication Data

US 2006/0176195 A1    Aug. 10, 2006

(51) Int. Cl.
*H03M 7/40*    (2006.01)

(52) U.S. Cl. .......................................... 341/67; 341/106

(58) Field of Classification Search .................. 341/50, 341/67, 65, 106
See application file for complete search history.

(56) References Cited

U.S. PATENT DOCUMENTS

| | | | | |
|---|---|---|---|---|
| 4,377,863 A | * | 3/1983 | Legory et al. .............. | 714/775 |
| 5,181,031 A | * | 1/1993 | Tong et al. .................... | 341/65 |
| 5,304,994 A | * | 4/1994 | Heikes ......................... | 341/50 |
| 5,940,833 A | * | 8/1999 | Benson ........................ | 707/100 |
| 6,563,440 B1 | * | 5/2003 | Kangas ......................... | 341/65 |
| 6,587,058 B1 | * | 7/2003 | Deeley et al. ................ | 341/67 |
| 6,900,746 B1 | * | 5/2005 | Lovell ......................... | 341/100 |
| 2002/0176494 A1 | * | 11/2002 | Zhao et al. .................. | 375/240 |
| 2003/0194012 A1 | * | 10/2003 | Sakai et al. ............ | 375/240.23 |
| 2003/0206124 A1 | * | 11/2003 | Lovell ......................... | 341/50 |

* cited by examiner

*Primary Examiner*—Peguy JeanPierre
(74) *Attorney, Agent, or Firm*—Buckley, Maschoff & Talwalkar LLC

(57) ABSTRACT

An apparatus and method of decoding variable length codes is provided. According to some embodiments, a method includes receiving a bitstream of a codebook of variable length codes, partitioning the codebook based on leading zeros (0) or ones (1), removing a common prefix, from each codeword to obtain a set of shortened codewords, determining a set of bit-patterns from the shortened codewords, partitioning the shortened codewords based on the set of bit-patterns to obtain sub-sets of the shortened codewords, removing a common prefix from each shortened codeword in the sub-sets of shortened codewords to obtain residual codewords, and forming a codebook based on the residual codewords.

33 Claims, 7 Drawing Sheets

Memory Map for Partition- 0
  1 codeword and 1 location
  Partition-has 0 cw
  No-address-bits-required

| Codeword | Index | Length (bits) |
|---|---|---|
| 0 | 1 | 0 |

FIG. 3A

Memory-Map for-Partition- 1
  29 codewords and 9 address-bits
  Range-of-address-bits-for-partition: [2,10]

| Codeword | Index | Length (bits) |
|---|---|---|
| 0111----- | 1 | 6 |
| 001------ | 2 | 5 |
| 00000---- | 6 | 7 |
| 11010---- | 10 | 7 |
| 1101100-- | 13 | 9 |
| 110111--- | 14 | 8 |
| 0110111-- | 17 | 9 |
| 01100---- | 18 | 7 |
| 01101000- | 21 | 10 |
| 000110--- | 22 | 8 |
| 1110----- | 24 | 6 |
| 0110101-- | 26 | 9 |
| 000010--- | 27 | 8 |
| 00010---- | 28 | 7 |
| 00011110- | 30 | 10 |
| 0000111-- | 31 | 9 |
| 10------- | 32 | 4 |
| 1100----- | 35 | 6 |
| 1111----- | 40 | 6 |
| 000111110 | 41 | 11 |
| 0001110-- | 43 | 9 |
| 0110110-- | 46 | 9 |
| 0100----- | 48 | 6 |
| 000111111 | 49 | 11 |
| 0000110-- | 54 | 9 |
| 0101----- | 56 | 6 |
| 11011011- | 57 | 10 |
| 11011010- | 62 | 10 |
| 01101001- | 63 | 10 |

FIG. 3B

Memory-Map for-Partition- 2
  22 codewords and 10 address-bits
  Range-of-address-bits-for-partition: [3,12]

| Codeword | Index | Length (bits) |
|---|---|---|
| 01-------- | 3 | 5 |
| 10-------- | 4 | 5 |
| 000111---- | 5 | 9 |
| 0000------ | 7 | 7 |
| 111100---- | 9 | 9 |
| 1101------ | 11 | 7 |
| 0011------ | 19 | 7 |
| 11111----- | 23 | 8 |
| 1100010010 | 25 | 13 |
| 11000101-- | 29 | 11 |
| 1110------ | 34 | 7 |
| 0010------ | 36 | 7 |
| 110001000- | 37 | 12 |
| 000100---- | 38 | 9 |
| 110000---- | 39 | 9 |
| 11001----- | 42 | 8 |
| 11000110-- | 45 | 11 |
| 000101---- | 47 | 9 |
| 111101---- | 50 | 9 |
| 11000111-- | 53 | 11 |
| 000110---- | 59 | 9 |
| 1100010011 | 61 | 13 |

FIG. 3C

Memory-Map for-Partition- 3
  2 codewords and 1 address-bit
  Range-of-address-bits-for-partition: [4,4]

| Codeword | Index | Length (bits) |
|---|---|---|
| 0 | 8 | 5 |
| 1 | 16 | 5 |

FIG. 3D

Memory-Map for-Partition- 4
 5 codewords and 4 address-bits
 Range-of-address-bits-for-partition: [5,8]

| Codeword | Index | Length (bits) |
|---|---|---|
| 0--- | 12 | 6 |
| 1000 | 51 | 9 |
| 11-- | 52 | 7 |
| 1001 | 55 | 9 |
| 101- | 60 | 8 |

FIG. 3E

Memory-Map for-Partition- 5
 1 codeword and 1 location
 Partition-has 1 cw,
 No-address-bits-required

| Codeword | Index | Length (bits) |
|---|---|---|
| 0 | 20 | 6 |

FIG. 3F

Memory-Map for-Partition- 6
 1 codeword and 1 location
 Partition-has 1 cw
 No-address-bits-required

| Codeword | Index | Length (bits) |
|---|---|---|
| 0 | 44 | 7 |

FIG. 3G

Memory-Map for-Partition- 7
 2 codewords and 1 address-bits
 Range-of-address-bits-for-partition: [8,8]

| Codeword | Index | Length (bits) |
|---|---|---|
| 1 | 33 | 9 |
| 0 | 58 | 9 |

FIG. 3H

Memory-Map for-Partition- 8
 1 codeword and 1 location
 Partition-has 1 cw
 No-address-bits-required

| Codeword | Index | Length (bits) |
|---|---|---|
| 0 | 15 | 8 |

FIG. 3I

SYSTEM AND METHOD FOR PARTITION AND PATTERN-MATCH DECODING OF VARIABLE LENGTH CODES

BACKGROUND

Electronic data, including text, graphics, voice, multimedia, and other strings of symbols, are commonly represented by binary codes. Binary coded data may be compressed in an effort to accurately represent the data while using as few bits as possible, thereby reducing the resources required for storing and/or transmitting the data. Binary codes of different or variable lengths may be used to represent different symbols in a bitstream of data. According to some binary code compression techniques, more frequently occurring symbols within a bitstream are represented with shorter codes, and less frequently occurring codes are represented using longer codes.

The codes used to represent the various symbols in a variable length coding (VLC) compression technique may be stored in a lookup table. A number of lookup tables may be required for a given VLC compression technique. The lookup table may be referenced when decoding a VLC bitstream to reconstruct the symbols represented by the various VLC codes therein. However, a relatively large number of bits may be required to represent some of the VLC symbols, particularly the less frequently occurring codes. Thus, a large amount of memory may be used to store a VLC lookup table in some typical implementations.

BRIEF DESCRIPTION OF THE DRAWINGS

FIGS. 3A–3I are memory maps of an exemplary VLC-decoding lookup table; and

DETAILED DESCRIPTION

Figure 1:
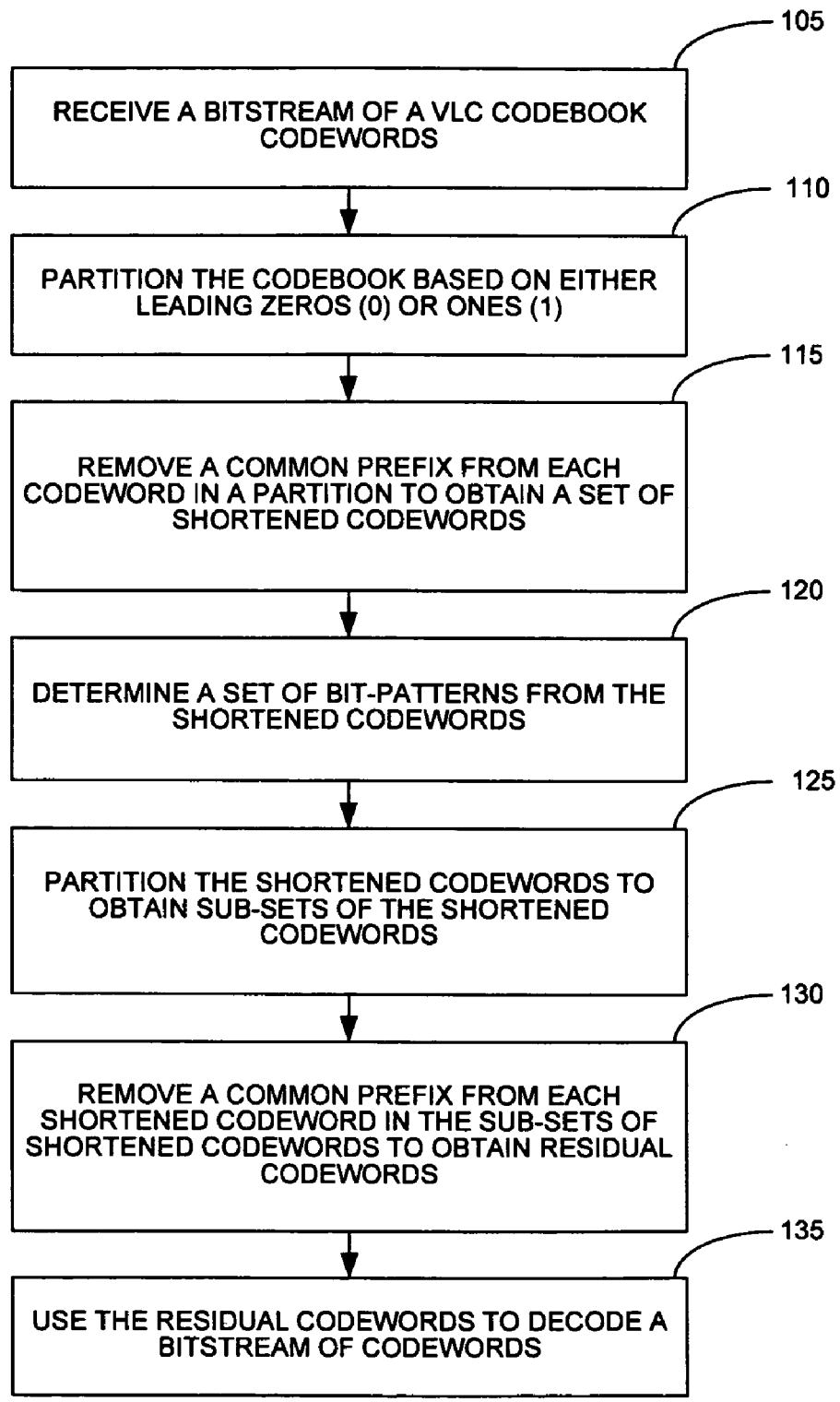
FIG. 1 is an exemplary flow diagram of a process of VLC-decoding, according to some embodiments hereof.

In some embodiments, the present disclosure provides a method to enhance the decoding rate of symbols from a coded bitstream. The coded bitstream includes one or more variable length codes (VLCs) produced by, for example, a Huffman code. Huffman coding is a VLC technique for lossless data compression that provides for an exact recovery of the original data from its compressed version. Compression is achieved by assigning longer codewords to less frequent input symbols and shorter codewords to the more frequent input symbols. Given a source symbol probability distribution, a Huffman coder achieves a reduction in the number of bits needed to encode the entire message with lossless compression.

Due to its simplicity and efficient compression capability, Huffman coding has been widely used in the international standards. In video-compression standards such as, for example, Windows® media player (WMV9), Huffman VLC-coding is used for encoding information.

A codebook is a collection of all VLC codewords and their corresponding symbols. Many codebooks are of size greater than 150 symbols. Given a binary stream composed of a sequence of codewords from a particular codebook, the process of determining the corresponding sequence of symbols is called VLC-decoding. The VLC-Codebooks in WMV9 are quite complex relative to older standards such as MPEG2 and H-263. For example, the longest codeword is of length 26 bits and the largest codebook is of size 185 symbols.

The set of all variable length codewords and associated alphabet is called a codebook. In some embodiments, a decision is made to partition the codebook based on either leading zeros (0s) or ones (1s). In some embodiments, the determination of whether to partition the codebook based on the number of leading 0's or 1's is based on which yields the most partitions. Each partition contains codewords having exactly a certain number of leading 1s or 0s.

Generally, the length of a codeword c in bits may be denoted as $l(c)$. The index of bits in a codeword starts at 0 and ends at $l(c)-1$. For a codebook $\Sigma$ in WMV9 containing Huffman codewords, let $N(\Sigma)$ be the number of partitions resulting from above partitioning method. The alphabet, $\alpha(\Sigma)$, either leading 0 or 1, is chosen based on which yeilds a larger number for $P(\Sigma)$. Herein, the partitions may be referred to as $P(\Sigma, i)$ for integer $0<=i<N(\Sigma)$.

To facilitate VLC-decoding, a decoding table is required for each $P(\Sigma, i)$. The size of the table is determined by the range of bits of the codewords in the partitions $P(\Sigma, i)$ that are used to populate (i.e., address) the table. Herein, $L(P(\Sigma, i))$ is the length in bits of the longest codeword in partition $P(\Sigma, i)$ and $\lambda(P(\Sigma, i))$ is the number of leading $\alpha(\Sigma)$s (i.e., 0s or 1s) in partition $P(\Sigma, i)$.

Now, considering a codeword c in $P(\Sigma, i)$, the length of c in bits is denoted as $l(c)$ and satisfies $\lambda(P(\Sigma, i))</l(c)\leq L(P(\Sigma, i))$. It is noted that the first $[1+\lambda(P(\Sigma, i))]$ bits of every codeword in partition $P(\Sigma, i)$ is the same (i.e., a common prefix).

If $l(c)<L(P(\Sigma, i))$ then c can be extend by appending all possible binary vectors of length $(L(P(\Sigma, i))-l(c))$ to obtain a set of extended-codewords from one codeword. According to the principles of Huffman coding, an extended-codeword cannot be equal to any other codeword in $P(\Sigma, i)$. This is satement is true based on the following properties of Huffman coding.

Property 1

Consider a codebook $\Sigma$ consisting of Huffman codewords of various lengths. Also, let c, c' be any two codewords from $\Sigma$. Without any loss of generality, let c be shorter than or equal in length to c'. Per a Huffman coding principle, c cannot be a prefix of c'. That is, $c(0,1, \ldots ,l(c)-1)\neq c'(0,1, \ldots ,l(c)-1)$.

Accordingly, since c, c' have the same number of leading bits (i.e., common prefix of either 1s or 0s), then the bit-segments of c, c' starting at $\lambda(P(\Sigma, i))$ must be different. It is noted that the number of extended-codewords obtained from c is $2^{[L(P(\Sigma,i))-l(c)-1]}$ Property 2

Consider two codewords c, c' from a Huffman codebook $\Sigma$ having lengths l, l' respectively. Also, let the number of leading $\alpha(\Sigma)$s in c, c' be e, e' respectively, and e<e'. Now, $c'(e+1)=\alpha'(\Sigma)\neq c(e+1)$. ($\alpha'(\Sigma)$ is logical complement of $\alpha(\Sigma)$)

Accordingly, if the shorter codeword is extended using an arbitrary bit vector to form an extended-codeword of length equal to the longer codeword, then the bit segments of the extended-codeword and the longer codeword starting at index (e+1) and ending at max(l, l') are different.

It should be noted that the derived property can be extended to more than two codewords c, c', c" with each having a different number of leading 1s or 0s.

Based on the foregoing Huffamn coding principles, for Huffman VLC-decoding lookup tables, a table for $P(\Sigma, i)$ is constructed by creating a set of extended-codewords all having the same length $L(P(\Sigma, i))$. For each extended-codeword in the table, the bits starting at index $1+\lambda(P(\Sigma, i))$ and ending at $L(P(\Sigma, i))-1$ form the address for the table. The size of the table is 2 power $(L(P(\Sigma,i))-\lambda(P(\Sigma,i)-1)$. For each codeword address in the table, the alphabet or symbol corresponding to the codeword is stored, and another entry for the length of the codeword is also stored.

For an arbitrary codeword from codebook $\Sigma$, the partition the codeword belongs to is determined by the number of leading 1s or 0s therein. For example, let a bitstream composed of a sequence of codewords be provided. The bitstream is parsed and the number of leading 1s or 0s is determined. The number of leading 1s or 0s (i.e., prefix) must equal $P(\Sigma,i)$ for some i. Then, the first $1+L(P(\Sigma,i))$ bits is extracted from the bitstream and, from these, the last $L(P(\Sigma,i))-\lambda(P(\Sigma,i)-1$ bits are fed into a lookup table for the particular partition, $P(\Sigma,i)$.

As stated above regarding VLC-decoding, the number of codewords for in a partition $P(\Sigma,i)$ is 2 power $(L(P(\Sigma,i))-\lambda(P(\Sigma,i)-1)$. This number of codewords may require too much memory for a particular memory implementation. For example, the availabe random access memory (RAM) may not be large enough to accommodate a lookup table sized to contain all of the codewords. Accordingly, in some embodiments herein, a process to reduce the memory requirments for a VLC-decoding table is provided.

Referring to FIG. 1, there is shown an exemplary process 100 for determining a table for VLC-decoding, according to some embodiments herein. A bitstream of codewords of a VLC codebook is received in an operation 105. The set of all variable length codewords and associated alphabet is called a codebook. The bitstream may be received by a VLC-decoding appratus, system, device, module, or machine having functionality in accordance with the processes disclolsed herein.

At operation 110, the codebook is partitioned based on either leading 0s or leading 1s. In some embodiments, the decision to partition on leading 0s or leading 1s is based on which partitioning basis yeilds the greastet number of partitions. Each partition contains codewords having exactly a certain number of leading 1s or leading 0s. All codewords (cws) in a partition have the common prefix ($\alpha(\Sigma)$, $\alpha(\Sigma)$, ..., $\alpha(\Sigma)$, $\underline{\alpha(\Sigma)}$) of length $1+\lambda(P(\Sigma,i))$. The maximum number of partitions will be equal to the maximum length of any codeword (cw) in the codebook.

At operation 115, the common prefix may be removed from each codeword in a partition. Since the prefix is the same length, $1+\lambda(P(\Sigma,i))$, for each codeword in the partition, a common number of bits are removed from each codeword in a given partition. Removal of the common prefix from each codeword yields a shortened or trucncated codeword. Herein, a set of shortened codewords for a partition-i is denoted as $Q(\Sigma, i)$.

At operation 120, a set of shortened or truncated codewords for a partition is considered. Regarding the set of shortened codewords for a partition, a set of bit-patterns $R(\Sigma, i)$ is determined. Each pattern $r(j)$ in $R(\Sigma, i)$ is chosen so that a number of codewords in $Q(\Sigma, i)$ have the same pattern of bits $r(j)$ forming a common prefix.

At operation 125, the shortened codewords in $Q(\Sigma, i)$ are partitioned into subsets based on the determined bit-patterns. Each codeword in a sub-set has a common bit-pattern as a prefix thereof. The codewords in, for example, a subset-j $R(\Sigma, i)$ have a common prefix of length a $1+\lambda(P(\Sigma,i))+$length $(r(j))$.

At operation 130, the prefix of length $1+\lambda(P(\Sigma,i))+$length $(r(j))$ is removed from each codeword in subset-j of $R(\Sigma, i)$ to yield a residual codeword. The residual length may be relatively small and variable compared to the codewords resulting from the initial partitioning at operation 110.

The residual codewords are used to form a lookup table. Since the residual codewords are relatively small, the resources (e.g., memory) required to store, tranmit, and process the table may be reduced in size.

Figure 2:
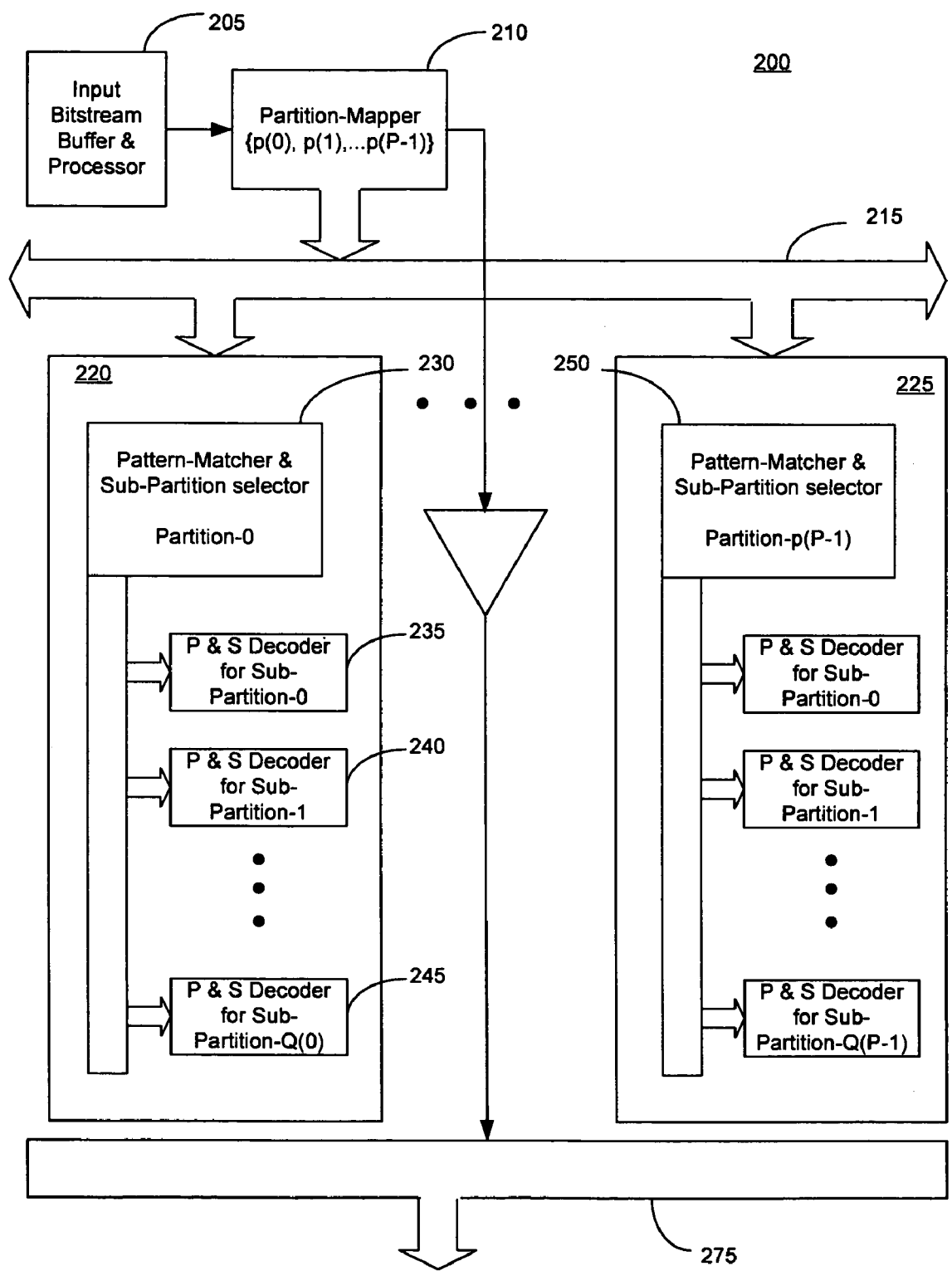
FIG. 2 is an exemplary block diagram of a system, according to some embodiments herein.

In some embodiments, processes disclosed herein may be implemented in software, hardware, and/or firmware using parallel processing. Parallel processing of the VLC-decoding processes herein may improve throughput of the VLC-decoding process FIG. 2 is an exemplary block diagram of an apparatus or system 200 that may be used to for implement VLC-decoding, in accordance with some embodiments herein. Apparatus 200 may be implemented in software, hardware, firmware, or a combination thereof. Input buffer and processor 205 receives a bitstream of VLC data. Input buffer and processor 205 may include a processor and memory to receive and process the incoming bitstream. Input buffer and processor 205 may use processing and/or storage resources of a host or remote device. Input buffer and processor 205 may buffer the bitstream in the memory thereof until a codeword or codebook is received.

Partition mapper 210 partitions the codebook into an initial number (P) of partitions (p), The partitions may be represented as $\{p(0), p(1), ... p(P-1)\}$. Having partitioned the codebook into P partitions, the partitions are passed to partition processors 220 and 225, via interface 215, for further partitioning and pattern matching, in accordance with methods and process disclosed herein. Processors 220 and 225 may operate in parallel. Although two partition processors 220 and 225 are shown in FIG. 2, it should be understood that more partition processors may be included in apparatus 200. For example, there may be as many partition processors as there are partitions determined by partition mapper 210.

Partition processor 220 includes a pattern matcher and sub-partition selector 230. Pattern matcher and sub-partition selector 230 may include the logic functionality to determine bit-patterns and partition a partition (e.g., partition-0) into sub-partitions as discussed for example, regarding FIG. 1.

Since a partition (e.g., partition-0) may be partitioned or divided into a number of sub-partitions, pattern matcher and sub-partition selector 230 may be coupled to a number of pattern and segmentation (P & S) decoders such as, for example, P & S decoders 235 through 245. It should be appreciated that the number of P & S decoders may vary depending, for example, on the number of sub-partitions determined by pattern matcher and sub-partition selector 230. For example, the number of P & S decoders may equal the number of sub-partitions determined by pattern matcher and sub-partition selector 230.

In some embodiments herein, the P & S decoders may be allocated dynamically, on an as-needed basis. That is, apparatus 200 resources may be allocated for P & S decoders on an as-needed basis to, for example, efficiently utilize the resources of or available for use by apparatus 200.

Partition processor 225, in general, may operate in a manner similar to partition processor 220.

Decoded symbols corresponding to the incoming bitstream are provided at interface 275. The decoded symbols, represented by relatively small codewords are provided at interface 275 where they may be collected, stored or otherwise made available for populating a new lookup table that includes reduced size codewords representing the symbols of the initial bitstream.

An example will now be discussed to illustrate certain aspects of the present disclosure. Listed below is a table, labeled Table 1, of a standard VLC lookup table.

TABLE 1

| Partition | No. of Codewords in Partition | Range of Address Bits | Index of Codewords in Partition | No. of Codewords in Partition |
|---|---|---|---|---|
| 0 | 1 | None | 0 | Unique CW |
| 1 | 29 | [2, 10] | 1, 2, 6, 10, 13, 14, 17, 18, 21, 22, 24, 26, 27, 28, 30, 31, 32, 35, 40, 41, 43, 46, 48, 49, 54, 57, 62, 63 | 29 |
| 2 | 22 | [3, 12] | 3, 4, 5, 7, 9, 11, 19, 23, 34, 36, 37, 38, 39, 42, 45, 47, 50, 53, 59, 61 | 22 |
| 3 | 2 | [4, 4] | 8, 16 | 2 |
| 4 | 5 | [5, 8] | 12, 51, 52, 55, 60 | 5 |
| 5 | 1 | None | 20 | 1 |
| 6 | 1 | None | 44 | 1 |
| 7 | 2 | [8, 8] | 33, 58 | 2 |
| 8 | 1 | None | 15 | 1 |

Referring to table 1 above, the codebook represented therein includes 64 symbols represented by variable length codewords having lengths that vary from 1 bit to 13 bits. The codebook is partitioned based on leading 0s. As used herein, bit indices start at 0 for leftmost bit, 1 for the next bit, and so on. Thus, there are 9 partitions, from partition (0) through partition (8).

FIGS. 3A through 3I are exemplary memory maps for partition (0) through partition (8). FIGS. 3A–3I provide a tabular listing of the codewords belonging to partitions 0 through 8.

Decoding the codewords in partition 0 and partitions 3 through 8 requires minimal processing resources since those partitions, in total, only require 24 memory locations. That is, based on the range of bit addresses encompassed by partitions 0 and 3 through 8, only 24 memory locations are needed to fully represent the codewords (e.g., 1+2+16+1+1+2+1=24 memory locations). However, the memory requirements for decoding the codewords in partitions 1 and 2 is excessive (e.g., $2^9+2^{10}=1536$ memory locations). Accordingly, partitions 1 and 2 may be decoded in accordance with the methods herein to reduce the memory requirements for decoding partitions 1 and 2.

Consider any codeword from partition-1 of the codebook, as illustrated in FIG. 3B. In a first decoding stage, a priority-decoder based on leading 0s determines that this codeword belongs to partition-1. Partition-1 has one leading 0 and a common prefix (01). Bit-0 is consumed. In a second decoding stage, a pattern-matcher (e.g., 230) capable of matching patterns present in the codewords of partition-1 (e.g., {(00), (01), (10), (11), (1101), (0111)}) determines which of the following sets of bit-patterns the codewords of partition-1 belongs to. This second stage decoding consumes more (common) bits of the codewords of partition-1.

For example, the 29 codewords in partition-1 are of the form (01)+(some-bit-pattern). The 29 codewords (cws) may be divided or partitioned into the following sub-sets:
1. 7 cws of form (01)+(00)+(some-bit-pattern), set-4 in partition-1
2. 4 cws of form (01)+(01)+(some-bit-pattern), set-5 in partition-1
3. 1 cw equal to (01)+(10), set-6 in partition-1
4. 8 cws of form (01)+(11)+(some-bit-pattern) set-7 in partition-1
5. 5 cws of form (01)+(0,1101)+(some-bit-pattern), set-2D in partition-1
6. 4 cws of form (01)+(00,0111)+(some-bit-pattern), set-47 in partition-1

Looking at a particular sub-set, for example, suppose the codeword belongs to set-4 of partition-1: Thus, the possible seven codewords are (01)+(00)+
1. (1)
2. (01,10)
3. (01,0)
4. (001,0)
5. (001,11)
6. (001,10)
7. (000)

The seven codewords in set-4 of part-1 shown above may be subjected to P & S decoder (235) as discussed hereinabove. Further partitioning may be based on leading 0s in view of the form of the seven codewords. The seven codewords may be partitioned based on leading 0s into sets including codewords 1; 2 and 3; 4, 5, and 6; and 7. Refer to table 2 for a tabular presentation of the seven codewords.

TABLE 2

| Sub-Partition Number | No. of Codewords in Partition | Range of Address-Bits (index in complete codeword) | Index-of-Codewords in partition-1 of Table-1 |
|---|---|---|---|
| 0 | 1 | None | 1 |
| 1 | 2 | 6 | 2, 3 |
| 2 | 3 | [7, 8] | 4, 5, 6 |
| 3 | 1 | None | 7 |

Thus partitioned, the codewords may be decoded using a new table of size 1+1+2+1=5, in a third decoding stage.

Looking at another sub-set, for example, suppose the codeword belongs to set-2D of partition-1: Thus, the possible five codewords are of the form (01)+(0, 1101)+
1. (11)
2. (10)
3. (01)
4. (001)
5. (000)

The 5 codewords above may be subjected to the partitioning and segmenting discussed hereinabove based on leading 0s. Thus, a new table of five codewords is required for decoding purposes.

Similar approaches may be used for decoding codewords in other sub-sets of partition 1. All the codewords in partition-1 can be decoded in 3 stages. Doing so will reveal that, at most, 40 memory locations are required for decoding codewords in partition-1. This result is in contrast to 512 memory locations.

As another example, consider any codeword from partition-2 of the codebook, as illustrated in FIG. 3C. Decoding the 21 codewords of partition-2 is accomplished in a manner similar to that demonstrated for parttion-1. The codewords of partition-2 may be categorized into the following seven sets:

1. 1 cw equal to (001)+(01): set 1 in partition-5
2. 1 cw equal to (001)+(10): set 2 in partition-6
3. 2 cws of form (001)+(001)+(some-bit-pattern): set 9 in partition-2
4. 4 cws of form (001)+(000)+(some-bit-pattern): set 8 in partition-2
5. 4 cws of form (001)+(111)+(some-bit-pattern): set F in partition-2
6. 3 cws of form (001)+(110)+(some-bit-pattern): set E in partition-2
7. 6 cws of form (001)+(110001)+(some-bit-pattern): set 71 in partition-2

In a first decoding-stage, the codeword is identified as belonging to partition-2. In a second decoding-stage, a pattern-matcher for variable length bit-patterns {(01), (10), (001), (000), (111), (110), (110001)} is used. The pattern-matcher identifies the sub-partition (i.e., sub-set) in which the codeword belongs. Once the codeword is identified as being in a particular sub-set in partition-2, the P&S table for that set may be constructed, as described above. The sub-set may be used to identifying the symbol corresponding to the codeword in a third decoding-stage. This P&S may be based on leading 0s or 1s.

By using the methods herein, the 64 symbols represented earlier in table 1 may be represented in lookup tables requiring less than 128 memory address locations.

It is noted that some memory may be required for pattern matching of the variable length bit-pattern (as demonstrated above). However, the reduction in memory locations is more than offset by the reduction in memory requirements obtained using the processes disclosed herein.

Figure 4:
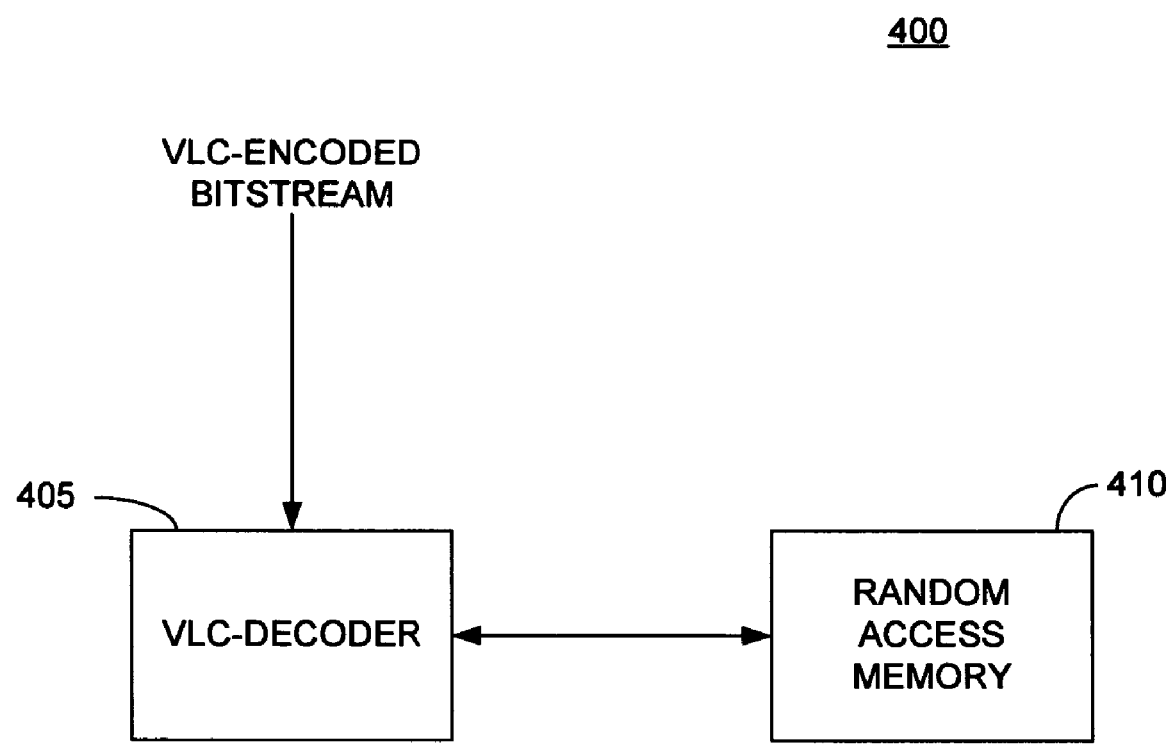
FIG. 4 is an exemplary block diagram of a system in accordance with some embodiments herein.

In some embodiments, the apparatus hereof (e.g., apparatus 200) may be coupled to or interfaced with other devices and components in a VLC-decoding system. For example, FIG. 4 illustrates an exemplary system 400 for decoding a VLC-encoded bitstream. VLC-decoder 405 may decode the bitstream input thereto in accordance with the VLC-decoding methods disclosed herein. Random access memory (RAM) unit 410 may be provided to store a lookup table. The lookup table stored in RAM unit 410 may be populated by residual codewords generated by VLC-decoder 405, in accordance with some embodiments herein.

Thus, the present disclosure may provide improved efficiencies for VLC-decoding by improving the decoding rate (i.e., throughput) by reducing the length of the codewords required to represent the symbols in a VLC lookup table.

The several embodiments described herein are solely for the purpose of illustration. The various features described herein need not all be used together, and any one or more of those features may be incorporated in a single embodiment. Therefore, persons in the art will recognize from this description that other embodiments may be practiced with various modifications and alterations.

What is claimed is:

1. A method comprising:
   partitioning a received bitstream of codewords based on leading zeros (0) or ones (1) based on a bit-level examination of each codeword;
   removing a prefix of bits, common to each codeword in a partition, from each codeword to obtain a set of shortened codewords, wherein the removed prefix is all zeros (0) or all ones (1) and corresponds to the basis of the partitioning;
   determining a set of bit-patterns from the shortened codewords;
   partitioning the shortened codewords based on the set of bit-patterns to obtain sub-sets of the shortened codewords; and
   removing a common prefix from the shortened codeword in the sub-sets of shortened codewords to obtain residual codewords.

2. The method of claim 1, wherein the received codewords comprise a codebook.

3. The method of claim 1, further comprising determining whether to partition the bitstream of codewords based on a number of leading zeros (0) or a number of leading ones (1).

4. The method of claim 3, wherein the determination is based on which basis, zeros (0) or leading ones (1), yields the greater number of partitions.

5. The method of claim 1, wherein the variable length codes comprise binary variable length codes.

6. The method of claim 5, wherein the binary variable length codes comprise Huffman codes.

7. The method of claim 1, wherein the prefix common to each codeword in a partition comprises the number of leading zeros (0) or the number of leading ones (1) for the codeword plus 1 bit.

8. The method of claim 1, wherein the set of bit-patterns determined for the shortened codewords are prefixes for the shortened codewords in each sub-set.

9. The method of claim 1, wherein the common prefix removed from the shortened codeword comprises the number of leading zeros (0) or the number of leading ones (1) for the codeword plus 1 bit plus the length of the bit-pattern for sub-set.

10. An apparatus comprising:
    a partition mapper to:
    receive a bitstream of variable length codes, the bitstream including codewords; and
    partition the bitstream based on either leading zeros (0) or ones (1) based on a bit-level examination of each codeword; and
    a sub-partition selector to:
    remove a prefix, common to each codeword in a partition, from each codeword to obtain a set of shortened codewords;
    determine a set of bit-patterns from the shortened codewords;
    partition the shortened codewords based on the set of bit-patterns to obtain subsets of the shortened codewords;
    remove a common prefix of bits from the shortened codeword in the sub-sets of shortened codewords to obtain residual codewords, wherein the removed prefix is all zeros (0) or all ones (1) and corresponds to the basis of the partitioning; and
    use a codebook based on the residual codewords.

11. The apparatus of claim 10, wherein the use includes decoding a bitstream of variable length codes using the codebook of residual codewords.

12. The apparatus of claim 10, wherein the bitstream of variable length codes comprise a codebook.

13. The apparatus of claim 10, further comprising determining whether to partition the bitstream based a number of leading zeros (0) or a number of leading ones (1).

14. The apparatus of claim 13, further comprising instructions that when executed cause the processor to make the determination based on which basis, zeros (0) or leading ones (1), yields the greater number of partitions.

15. The apparatus of claim 10, wherein the variable length codes comprise binary variable length codes.

16. The apparatus of claim 10, wherein the binary variable length codes comprise Huffman codes.

17. The apparatus of claim 10, wherein the prefix common to each codeword in a partition comprises the number of leading zeros (0) or the number of leading ones (1) for the codeword plus 1 bit.

18. The apparatus of claim 10, wherein the set of bit-patterns determined for the shortened codewords are prefixes for the shortened codewords in each subset.

19. The apparatus of claim 10, wherein the common prefix removed from each shortened codeword comprises the number of leading zeros (0) or the number of leading ones (1) for the codeword plus 1 bit plus the length of the bit-pattern for sub-set.

20. The apparatus of claim 10, further comprising more than one processor for executing the instructions.

21. The apparatus of claim 20, wherein the more than one processors operate in parallel.

22. A system comprising:
a partition mapper to:
partition a bitstream of codewords based on either leading zeros (0) or ones (1) based on a bit-level examination of each codeword;
remove a prefix of bits, common to each codeword in a partition, from each codeword to obtain a set of shortened codewords, wherein the removed prefix is all zeros (0) or all ones (1) and corresponds to the basis of the partitioning;
a sub-partition selector to:
determine a set of bit-patterns from the shortened codewords;
partition the shortened codewords based on the set of bit-patterns to obtain sub-sets of the shortened codewords;
remove a common prefix from the shortened codeword in the sub-sets of shortened codewords to obtain residual codewords; and
a random access memory to store a lookup table associated with the residual codewords.

23. The system of claim 22, further comprising determining whether to partition the bitstream of codewords based a number of leading zeros (0) or a number of leading ones (1).

24. The system of claim 23, further comprising more than one processor for executing the instructions, wherein the more than one processors operate in parallel.

25. A method comprising:
partitioning a received bitstream of codewords based on leading zeros (0) or ones (1) based on a bit-level examination of each codeword;
removing a prefix of bits, common to each codeword in a partition, from each codeword to obtain a set of shortened codewords, wherein the removed prefix is all zeros (0) or all ones (1) and corresponds to the basis of the partitioning;
determining a set of bit-patterns from the shortened codewords;
partitioning the shortened codewords based on the set of bit-patterns to obtain sub-sets of the shortened codewords;
removing a common prefix from the shortened codeword in the sub-sets of shortened codewords to obtain residual codewords; and
decoding a bitstream of variable length codes using the residual codewords.

26. The method of claim 25, wherein the received codewords comprise a codebook.

27. The method of claim 25, further comprising determining whether to partition the bitstream of codewords based on a number of leading zeros (0) or a number of leading ones (1).

28. The method of claim 27, wherein the determination is based on which basis, zeros (0) or leading ones (1), yields the greater number of partitions.

29. The method of claim 25, wherein the variable length codes comprise binary variable length codes.

30. The method of claim 29, wherein the binary variable length codes comprise Huffman codes.

31. The method of claim 25, wherein the prefix common to each codeword in a partition comprises the number of leading zeros (0) or the number of leading ones (1) for the codeword plus 1 bit.

32. The method of claim 25, wherein the set of bit-patterns determined for the shortened codewords are prefixes for the shortened codewords in each sub-set.

33. The method of claim 25, wherein the common prefix removed from the shortened codeword comprises the number of leading zeros (0) or the number of leading ones (1) for the codeword plus 1 bit plus the length of the bit-pattern for sub-set.

* * * * *